(12) United States Patent
Uchida (10) Patent No.: US 9,371,984 B2
(45) Date of Patent: Jun. 21, 2016

(54) LIGHT IRRADIATION APPARATUS AND PRINTING APPARATUS

(71) Applicant: KYOCERA Corporation, Kyoto-shi, Kyoto (JP)

(72) Inventor: Shinya Uchida, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 14/425,110

(22) PCT Filed: Aug. 29, 2013

(86) PCT No.: PCT/JP2013/073139
§ 371 (c)(1),
(2) Date: Mar. 2, 2015

(87) PCT Pub. No.: WO2014/034778
PCT Pub. Date: Mar. 6, 2014

(65) Prior Publication Data
US 2015/0276196 A1 Oct. 1, 2015

(30) Foreign Application Priority Data
Aug. 31, 2012 (JP) .................. 2012-191184

(51) Int. Cl.
*B41J 2/01* (2006.01)
*F21V 29/51* (2015.01)
*F21V 29/70* (2015.01)
*F21V 15/01* (2006.01)
*F21V 23/00* (2015.01)
*B41J 11/00* (2006.01)
*B41M 7/00* (2006.01)
*F21W 131/403* (2006.01)

(52) U.S. Cl.
CPC ............. *F21V 29/51* (2015.01); *B41J 11/002* (2013.01); *F21V 15/01* (2013.01); *F21V 23/004* (2013.01); *F21V 29/70* (2015.01); *B41J 11/0015* (2013.01); *B41M 7/009* (2013.01); *B41M 7/0072* (2013.01); *B41M 7/0081* (2013.01); *F21W 2131/403* (2013.01)

(58) Field of Classification Search
None
See application file for complete search history.

(56) References Cited

FOREIGN PATENT DOCUMENTS

| JP | 2008-173968 A | | 7/2008 | |
|---|---|---|---|---|
| JP | 2008173968 A | * | 7/2008 | ............. B41J 11/002 |
| JP | 2009-56698 A | | 3/2009 | |

(Continued)

OTHER PUBLICATIONS

Taguchi, Akira et al. (JP2010274256A—Machine Translation), Light Irradiation Head, Exposure Device, Image Forming Apparatus, Liquid Droplet Curing Device, and Liquid Droplet Curing Method, Dec. 9, 2010 Paragraphs 0034, 0042-0043.*
Uchida, Shinya et al. (JP2009056698A—Machine Translation), Optical Printing Head and Image Forming Apparatus Equipped With This, Mar. 19, 2009, Paragraphs 0021-0022, 0030-0031.*
Washimi, Yoshikazu (JP2011230751A—Machine Translation), Led Lighting Fixture, Nov. 17, 2011 Paragraph 0033.*

(Continued)

*Primary Examiner* — Lisa M Solomon
(74) *Attorney, Agent, or Firm* — Procopio, Cory, Hargreaves & Savitch LLP (57) ABSTRACT

A light irradiation apparatus includes a housing configured to house a light irradiation device including a plurality of light-emitting elements arranged, a drive substrate having a circuit to which a constant current generation device is electrically connected, a heat dissipation member having a plate-shape, and a cooling pipe. The light irradiation device is disposed on one main surface of the heat dissipation member, and the constant current generation device is disposed on the other main surface of the heat dissipation member or on the drive substrate, the drive substrate being disposed on the other main surface of the heat dissipation member.

5 Claims, 7 Drawing Sheets

(56) References Cited

FOREIGN PATENT DOCUMENTS

| JP | 3158033 U | 3/2010 |
| JP | 2010-274256 A | 12/2010 |
| JP | 2011-230751 A | 11/2011 |
| JP | 2012-49453 A | 3/2012 |
| JP | 2012-178303 A | 9/2012 |

OTHER PUBLICATIONS

Nakano, Keitaro et al. (JP2008173968A—Machine Translation), Ultraviolet Irradiation Device, Jul. 32, 2008 Paragraphs 0032-0033, 0054.*

International Search Report dated Dec. 10, 2013 issued in counterpart International Application No. PCT/JP2013/073139.

\* cited by examiner

LIGHT IRRADIATION APPARATUS AND PRINTING APPARATUS

TECHNICAL FIELD

The present invention relates to a light irradiation apparatus and a printing apparatus that are used for curing an ultraviolet curable resin or a coating material.

BACKGROUND ART

In the related art, ultraviolet ray irradiation apparatuses are used particularly for curing an ultraviolet curable resin that is used for bonding or the like of small-sized parts in the field of electronic components, or the like, or for curing an ultraviolet curable ink that is used in the field of printing. High-voltage mercury lamps, metal halide lamps, or the like are used for lamp light sources of the ultraviolet ray irradiation apparatuses.

When the ultraviolet light-emitting elements are used as the lamp light sources, generation of heat can be relatively suppressed. However, depending on use, a problem may occur such that heat is generated from the ultraviolet ray irradiation apparatuses, and the light emission efficiency of the ultraviolet light-emitting elements degrades due to this heat or such that the lifespan of the ultraviolet light-emitting elements becomes shorter. Thus, a device that cools an ultraviolet ray irradiation apparatus is suggested, for example, as described in Japanese Registered Utility Model No. 3158033.

However, such a device becomes a complicated and large-sized device in which there is a need for providing a cooling fan. Moreover, a large amount of heat is also generated from a constant current generation device for driving the ultraviolet light-emitting elements.

SUMMARY OF INVENTION

An object of the invention is to provide a downsized light irradiation apparatus in which the light emission efficiency of ultraviolet light-emitting elements is relatively high and the lifespan of the ultraviolet light-emitting elements is relatively long, while cooling of the ultraviolet light-emitting elements and the constant current generation device is efficiently carried out.

A light irradiation apparatus of the invention includes a housing configured to house
  a light irradiation device comprising a plurality of light-emitting elements arranged;
  a drive substrate which is configured to drive the plurality of light-emitting elements, and comprises a circuit to which a constant current generation device is electrically connected;
  a heat dissipation member having a plate-shape; and
  a cooling pipe configured for allowing a refrigerant to flow into the heat dissipation member,
  wherein
  the light irradiation device is disposed on one main surface of the heat dissipation member, and
  the constant current generation device is disposed on the other main surface of the heat dissipation member or on the drive substrate, the drive substrate being disposed on the other main surface of the heat dissipation member.

A printing apparatus of the invention includes
  conveying means that conveys a recording medium having light permeability;
  printing means that carries out printing on a recording medium with an ultraviolet curable ink or an ultraviolet curable resin; and
  the above-described light irradiation apparatus that irradiates the recording medium printed with light.

DESCRIPTION OF EMBODIMENTS

Hereinafter, examples of embodiments of a light irradiation apparatus and a printing apparatus of the invention will be described, referring to the drawings. In addition, the following example illustrates the embodiments of the invention, but the invention is not limited to the embodiments.

(Embodiment of Light Irradiation Apparatus)

Figure 1:
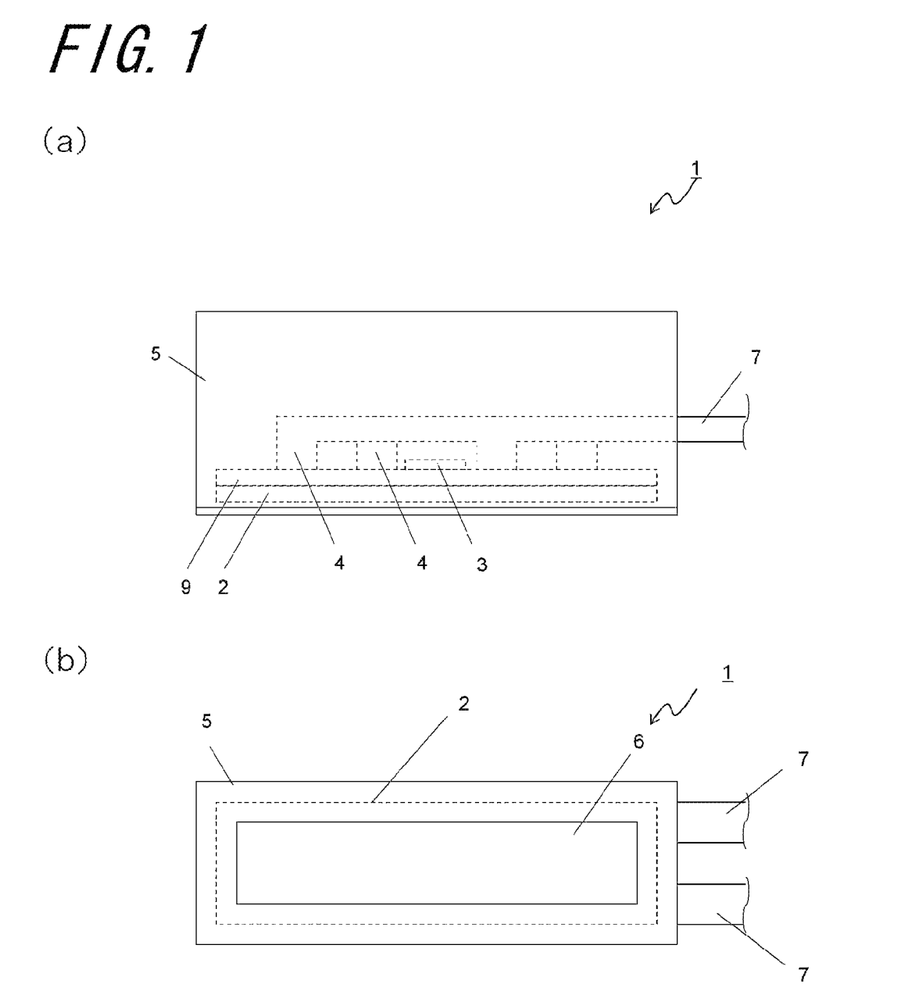
FIG. 1(a) is a side view illustrating an example of an embodiment of a light irradiation apparatus of the invention.
FIG. 1(b) is a plan view illustrating an example of the embodiment of the light irradiation apparatus of the invention.

A light irradiation apparatus 1 illustrated in FIG. 1 is incorporated into a printing apparatus, such as an offset printing apparatus or an inkjet printing apparatus that uses an ultraviolet curable ink, and is able to irradiate an object (recording medium) with ultraviolet rays after the ultraviolet curable ink is deposited on the object, thereby curing the ultraviolet curable ink.

The light irradiation apparatus 1 includes a housing 5 configured to house a light irradiation device 2 including a plurality of light-emitting elements 20 arranged; a drive substrate 3 which is configured to drive the plurality of light-emitting elements 20, and has a circuit to which a constant current generation device 3a is electrically connected; a heat dissipation member 9; a cooling pipe 4 configured for allowing a refrigerant to flow into the heat dissipation member 9.

Figure 2:
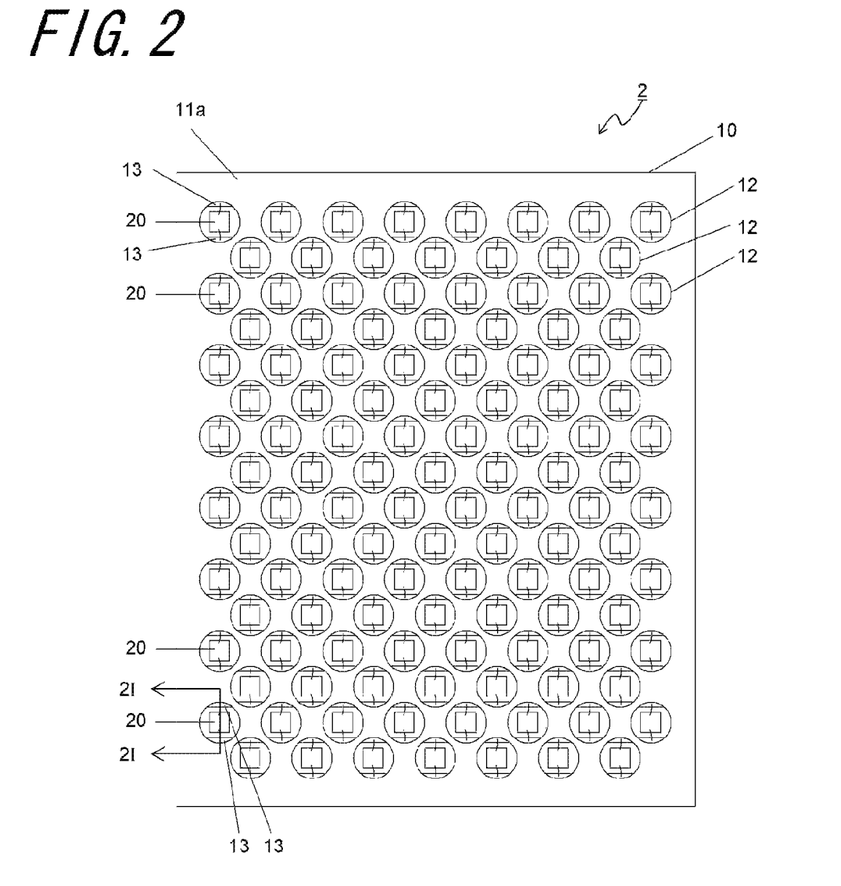
FIG. 2 is a plan view of a light irradiation device illustrated in FIG. 1.
Figure 3:
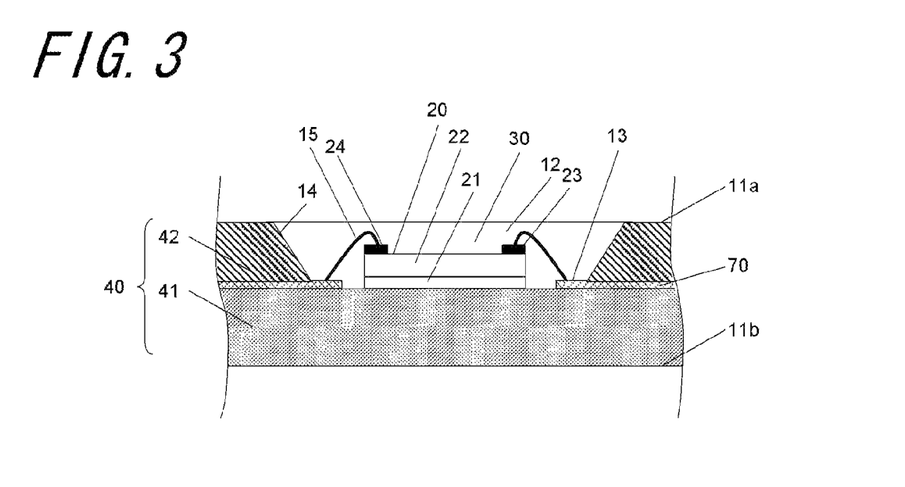
FIG. 3 is a cross-sectional view taken along the line 2*l*-2*l* in the light irradiation device illustrated in FIG. 2.

First, the light irradiation device 2 that constitutes the light irradiation apparatus 1 will be described with reference to FIG. 2 and FIG. 3.

The light irradiation device 2 functions as an ultraviolet irradiation light source of the light irradiation apparatus 1.

The light irradiation device 2 includes a base 10 that has a plurality of openings 12 on one surface 11a, a plurality of connection pads 13 that are provided within the respective openings 12, a plurality of light-emitting elements 20 that are disposed within the respective openings 12 of the base 10 and electrically connected to the connection pads 13, and a plurality of sealing materials 30 that fill the respective openings 12 and cover the light-emitting elements 20.

The base 10 includes a stacked body 40 formed by laminating a first insulating layer 41 and a second insulating layer 42, and internal electrical wiring 70 that connects the light-emitting elements 20 together. The base 10 has a rectangular shape in a plan view from the one surface 11a side, and supports the light-emitting elements 20 within the openings 12 provided in the one main surface 11a.

The first insulating layer 41, for example, is formed of ceramics such as an aluminum oxide sintered body, an aluminum nitride sintered body, a mullite sintered body or glass ceramics, or resins such as epoxy resin or a liquid crystal polymer (LCP).

The internal electrical wiring 70, for example, is formed in a predetermined pattern from a conductive material such as tungsten (W), molybdenum (Mo), manganese (Mn) or copper (Cu), and functions as power supply wiring for supplying an electric current to the light-emitting elements 20 or the electric current from the light-emitting elements 20.

The second insulating layer 42 laminated on the first insulating layer 41 is provided with the openings 12 passing through the second insulating layer 42.

An inner peripheral surface 14 of each opening 12 inclines so that the shape of the opening has a larger hole diameter nearer the one surface 11a side of the base 10 than a placement surface for each light-emitting element 20, and has, for example, a circular shape when viewed in a plan view. In addition, the opening shape is not limited to the circular shape, and may be a rectangular shape.

Such an opening 12 reflects the light emitted from the light-emitting element 20 upward on the inner peripheral surface 14 thereof, and has a function of improving light extraction efficiency.

In order to improve the light extraction efficiency, it is preferable that materials of the second insulating layer 42 are formed of porous ceramic materials having relatively excellent reflectivity with respect to the light in an ultraviolet region, for example, an aluminum oxide sintered body, a zirconium oxide sintered body, and an aluminum nitride sintered body. Additionally, from the viewpoint of improving the light extraction efficiency, a metallic reflective film may be provided on the inner peripheral surface 14 of the opening 12.

Such openings 12 are arrayed in vertical and horizontal directions over the entire surface 11a of the base 10. For example, the openings are arrayed in a staggered lattice shape, namely, are arrayed in a zigzag arrangement having a plurality of rows. By adopting such an arrangement, it is possible to dispose the light-emitting element 20 with higher density, and it is possible to make illuminance per unit area higher. Here, the expression "being arrayed in a staggered lattice shape" has the same meaning as "being disposed so as to be located at lattice points of an oblique lattice".

In addition, when the illuminance per unit area can be sufficiently secured, the openings may be arrayed in a positive lattice, or the like.

The base 10 including the stacked body 40 consisting of the first insulating layer 41 and the second insulating layer 42 as described above is manufactured through the following processes if the first insulating layer 41 and the second insulating layer 42 are made of ceramics or the like.

First, a plurality of ceramic green sheets are prepared. Holes corresponding to the openings are formed in the ceramic green sheets equivalent to the openings 12 by punching or otherwise. Next, after metal paste serving as the internal electrical wiring 70 is printed on the green sheets, the green sheets are laminated so that the printed metal paste is located between the green sheets. Examples of the metal paste serving as the internal electrical wiring 70 include metal paste containing metal such as tungsten (W), molybdenum (Mo), manganese (Mn) or copper (Cu). Next, the base 10 having the internal electrical wiring 70 and the openings 12 can be formed by firing the above-described stacked body, thereby firing the green sheets and the metal paste altogether.

Additionally, when the first insulating layer 41 and the second insulating layer 42 are made of resin, for example, the following method is adopted as a method for manufacturing the base 10.

First, a precursor sheet of thermosetting resin is prepared. Next, a plurality of the precursor sheets are laminated so that a lead terminal serving as the internal electrical wiring 70 and made of a metallic material is disposed between the precursor sheets and the lead terminal is embedded in the precursor sheets. Examples of a material for forming the lead terminal include a metallic material such as Cu, Ag, Al, an iron (Fe)-nickel (Ni)-cobalt (Co) alloy or an Fe—Ni alloy. Then, after holes corresponding to the openings 12 are formed in the precursor sheets by laser processing, etching or otherwise, the base 10 is completed by thermally curing the laminate. In addition, when the openings 12 are formed by the laser processing, the precursor sheets may be processed after being thermally cured.

Meanwhile, the connection pad 13 electrically connected to the light-emitting element 20, the light-emitting element 20 connected to the connection pad 13 with a joining material 15 such as solder, a gold (Au) wire or an aluminum (Al) wire, and the sealing material 30 that seals the light-emitting element 20 are provided within the opening 12 of the base 10.

The connection pad 13 is formed of, for example, a metal layer made of a metallic material such as tungsten (W), molybdenum (Mo), manganese (Mn) or copper (Cu). In addition, a nickel (Ni) layer, a palladium (Pd) layer or a gold (Au) layer may be further laminated on the metal layer if necessary. The connection pad 13 is connected to the light-emitting element 20 with the joining material 15 such as solder, a gold (Au) wire or an aluminum (Al) wire.

Additionally, the light-emitting element 20 is constituted of, for example, a light-emitting diode formed by laminating a p-type semiconductor layer and an n-type semiconductor layer made of a semiconductor material such as GaAs or GaN, on an element substrate 21 such as a sapphire substrate, an organic EL device in which a semiconductor layer is made of an organic material, or the like.

The light-emitting element 20 includes a semiconductor layer 22 having a light-emitting layer, and element electrodes 23 and 24 that are connected to the connection pad 13 disposed on the base 10 via the joining material 15 such as solder, a gold (Au) wire or an aluminum (Al) wire and that are made of a metallic material such as Ag, and is wire-bonded to the base 10. Then, the light-emitting element 20 emits light having a predetermined wavelength, with a predetermined luminance, according to an electric current that flows between the element electrodes 23 and 24. In addition, it is well-known that the element substrate 21 can be omitted. Additionally, the connection between the element electrodes 23 and 24 of the light-emitting element 20 and the connection pad 13 may be performed by a flip-chip bonding technique, which is well-known in the related art, using solder or the like for the joining material 15.

In the present example, there is adopted an LED in which the peak spectrum of the wavelength of the light emitted from the light-emitting element 20 is, for example, UV light of 250 to 440 [nm]. In addition, the light-emitting element 20 is formed by a thin film formation technique.

The light-emitting element 20 is sealed with the above-described sealing material 30.

As the sealing material 30, an insulating material such as a light-transmitting resin material is used, and the sealing material 30 seals the light-emitting element 20, thereby suppressing moisture entering from the outside, or absorbs the shock from the outside, thereby protecting the light-emitting element 20.

Additionally, for the sealing material 30, a material having a refractive index between the refractive index (1.7 in the case of sapphire) of the element substrate 21 that constitutes the light-emitting element 20 and the refractive index (about 1.0) of air, for example, silicone resin (refractive index: about 1.4) or the like is used, thereby making it possible to improve the light extraction efficiency of the light-emitting element 20.

The sealing material 30 is formed by filling the opening 12 with a precursor such as silicone resin after the light-emitting element 20 is mounted on the base 10, and curing the precursor.

The drive substrate 3 is connected to the light irradiation device 2, the constant current generation device 3*a*, and the external device, respectively, and has the function of driving the plurality of light-emitting elements 20.

The drive substrate 3 of the present example is made of ceramics and is manufactured through the following processes. First, a ceramic green sheet is prepared.

Next, a metal paste serving as electrical wiring for connection with the light irradiation device 2, the constant current generation device 3*a*, and other electronic components, respectively, or connection with an external device is printed on the ceramic green sheet. Examples of the metal paste serving as the electrical wiring include metal paste containing metal such as tungsten (W), molybdenum (Mo), manganese (Mn) or copper (Cu).

In addition, the drive substrate 3 may be made of resin. As the method for manufacturing the substrate 2 in this case, for example, the following method is considered. First, a precursor sheet of thermosetting resin is prepared. Next, a plurality of the precursor sheets are laminated so that a lead terminal which serves as electrical wiring for connection with the light irradiation device 2, the constant current generation device 3*a*, and other electronic components, respectively, or for connection with an external device and which is made of a metallic material, is disposed between the precursor sheets, and the lead terminal is embedded in the precursor sheets. Examples of a material for forming the lead terminal include a metallic material such as copper (Cu), silver (Ag), aluminum (Al), an iron (Fe)-nickel (Ni)-cobalt (Co) alloy or an iron (Fe)-Nickel (Ni) alloy. Then, the drive substrate 3 is completed by thermally curing the laminate.

The constant current generation device 3*a* of the present example is a field effect transistor (FET), and functions as a constant current source that supplies a constant current to the plurality of light-emitting elements 20. In addition, arbitrary types of devices may be adopted as the constant current generation device 3*a* as long as the devices supply a constant current to the plurality of light-emitting elements 20, such as current regulative diodes (CRD).

The constant current generation device 3*a* of the present example is disposed on the drive substrate 3.

Figure 4:
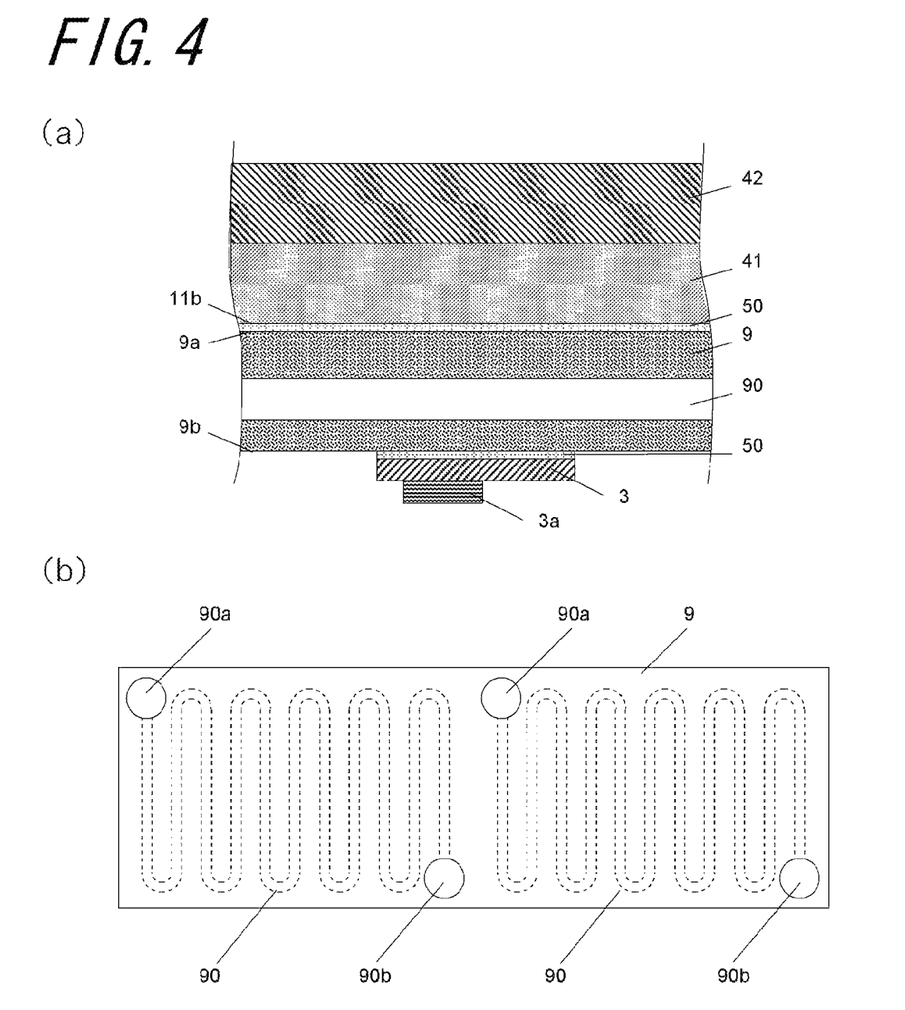
FIG. 4(a) is a cross-sectional view illustrating a joining portion between the light irradiation device and a drive substrate, and a heat dissipation member, which are illustrated in FIG. 1.
FIG. 4(b) is a plan view of the heat dissipation member illustrated in FIG. 1.

The heat dissipation member 9 of the present example, as illustrated in FIG. 4(*a*), is plate-shaped. The light irradiation device 2 is disposed via an adhesive 50 such as silicone resin or epoxy resin deposited on one main surface 9*a* of the heat dissipation member, that is, the one main surface 9*a* of the heat dissipation member 9 and the other surface 11*b* of the base 10 are bonded together via the adhesive 50. The drive substrate 3 is disposed via the adhesive 50 such as silicone resin and epoxy resin deposited on the other main surface 9*b* of the heat dissipation member. Therefore, the heat dissipation member supports the light irradiation device 2 and the drive substrate 3, absorbs the heat of the light-emitting element 20 that is thermally stored in the base 10 of the light irradiation device 2 and the heat of the constant current generation device 3*a* that is thermally stored in the drive substrate 3, and dissipates the absorbed heat to the outside. A material for forming the heat dissipation member 9 includes, preferably, a material with high thermal conductivity, for example, a metallic material such as copper (Cu) or aluminum (Al), ceramics, or a resin material. In the present example, copper (Cu) is adopted as the material for forming the heat dissipation member 9.

In addition, although the constant current generation device 3*a* of the present example is disposed on the drive substrate 3, the constant current generation device may be disposed directly on the other main surface 9*b* of the heat dissipation member 9 or disposed via the adhesive 50 such as silicone resin or epoxy resin.

Additionally, as illustrated in FIG. 4(*b*), the heat dissipation member 9 has therein a heat dissipation flow passage 90 for allowing a refrigerant used for cooling to flow therethrough. The heat dissipation flow passage 90 includes a supply port 90*a* for supplying the refrigerant to the other main surface 9*b* of the heat dissipation member 9, and a discharge port 90*b* for discharging the refrigerant.

The cooling pipe 4 is connected to the supply port 90*a* and the discharge port 90*b*. The cooling pipe 4 and the above-described light irradiation device 2 and the drive substrate 3 are housed in the housing 5. An outer wall of the housing 5 is provided with a through-hole 107 for connecting the cooling pipe 4 to an external cooling pipe 7 disposed outside the housing 5, and the cooling pipe 4 and the external cooling pipe 7 are connected together via the through-hole 107. Also, the refrigerant is supplied to the heat dissipation flow passage 90 of the heat dissipation member 9 via the external cooling pipe 7 and the cooling pipe 4, and the heat dissipation member 9 is excellently cooled by the supplied refrigerant. Therefore, the heat dissipation effect of the heat dissipation member 9 can be enhanced. The refrigerant having used for the cooling of the heat dissipation member 9 is discharged to the outside via the discharge port 90*b*, the cooling pipe 4, and the external cooling pipe 7. In addition, the shape of the heat dissipation flow passage 90 for allowing the refrigerant to flow therethrough and the arrangement of the heat dissipation flow passage within the heat dissipation member 9 may be arbitrary shapes and arrangements as long as the heat generated from the light irradiation device 2 and the constant current generation device 3*a* can be efficiently cooled.

In this way, in the present example, the light irradiation device 2 and the constant current generation device 3 can be relatively efficiently cooled by disposing the light irradiation device 2 on the one main surface 9*a* of the heat dissipation member 9 and by disposing the constant current generation device 3*a* on the other main surface 9*b* via the drive substrate 3. As a result, the small-sized light irradiation apparatus 1 in which the illuminance of the light irradiation device 2 is relatively high and illuminance variation is relatively little is realized.

Figure 5:
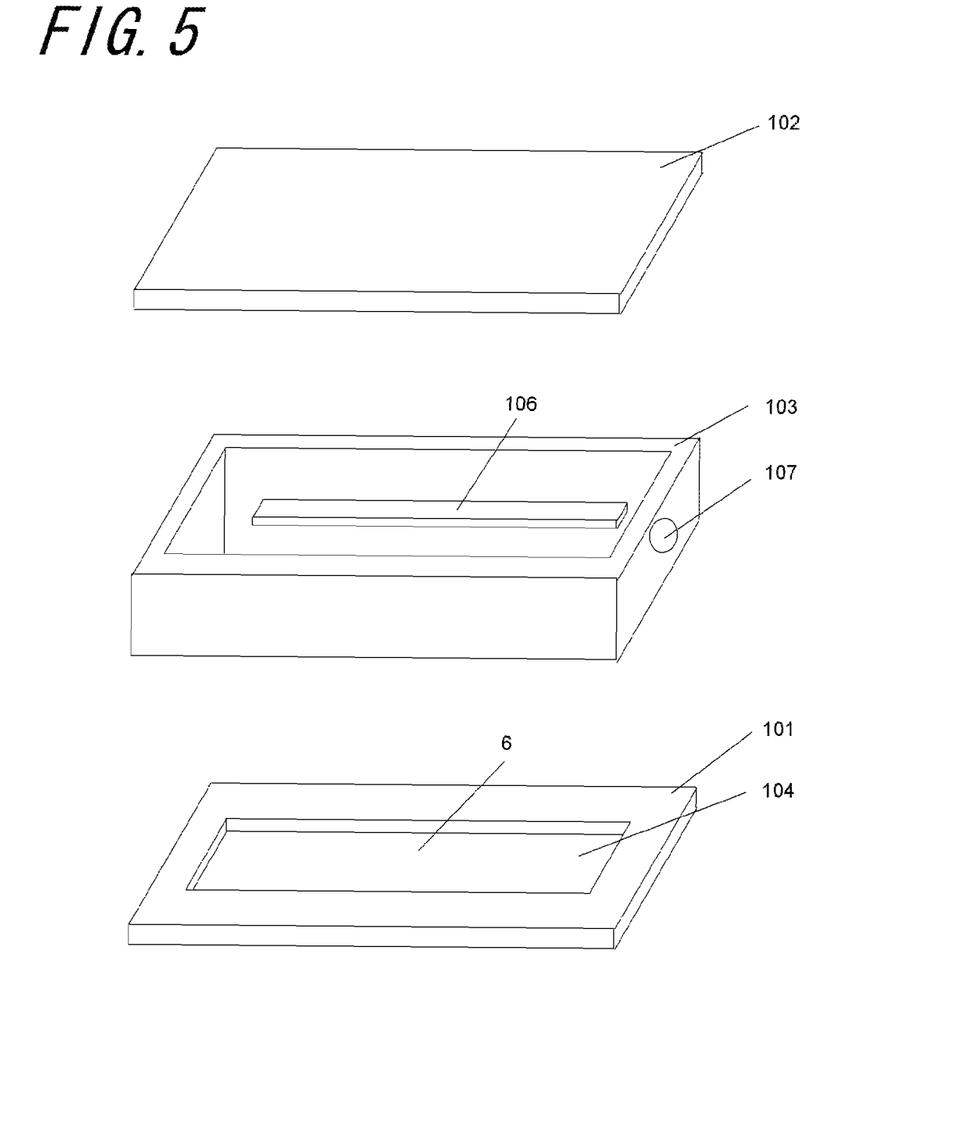
FIG. 5 is an exploded perspective view of a housing illustrated in FIG. 1.
Figure 6:
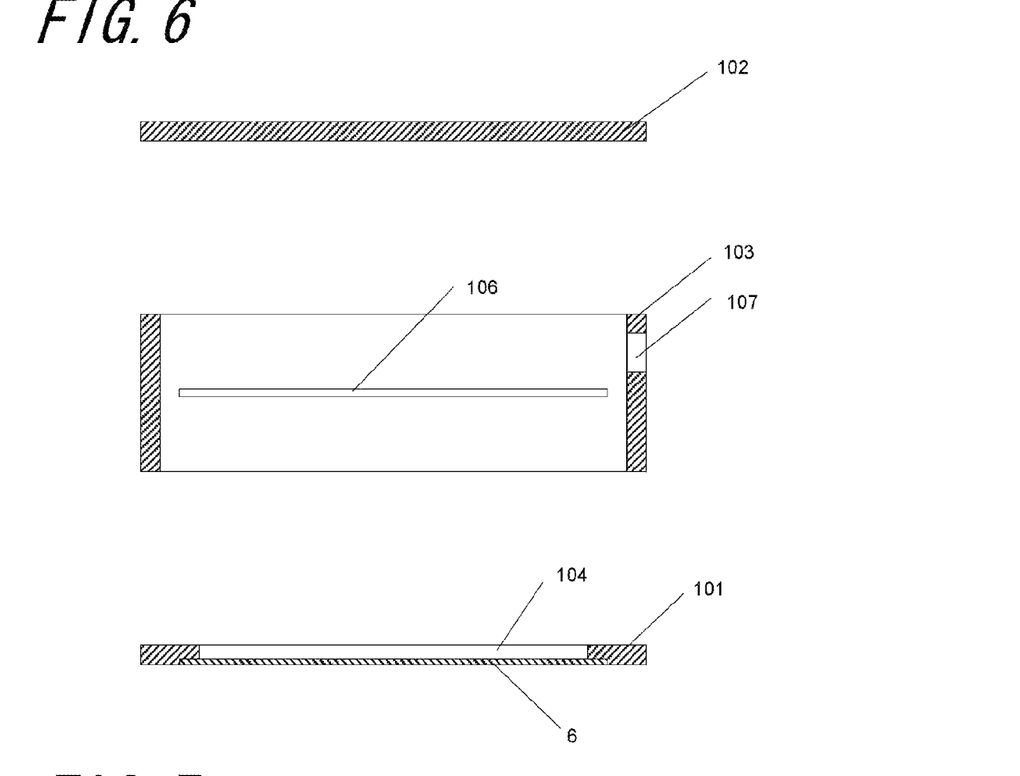
FIG. 6 is an exploded cross-sectional view of the housing illustrated in FIG. 1.

As illustrated in FIG. 5 and FIG. 6, the housing 5 is constituted of a first flat plate 101, a second flat plate 102, a frame body 103, and a cover glass 6. An opening 104 is provided at a central portion of the first flat plate 101, and the cover glass 6 made of quartz or the like is attached so as to cover the opening 104. The light emitted from the light irradiation device 2 is radiated through the cover glass 6 from the opening 104. The material of the cover glass only needs to be a material in which the transmittance of ultraviolet rays is high and degradation caused by the ultraviolet rays is little. The cover glass 6 has the function of keeping the ultraviolet curable ink or the like from being scattered to contaminate the light irradiation device 2, when the light irradiation apparatus 1 is incorporated into a printing apparatus in use. If the cover glass is contaminated, maintenance such as cleaning can also be relatively easily performed. Thus, not only the influence on the illuminance degradation of light emitted from the light irradiation device 2 due to contamination can be relatively reduced, but also illuminance recovery can be easily performed even if the illuminance degradation due to contamination occurs.

Additionally, in the present example, in consideration of mismatching of the coefficients of thermal expansion between the quartz glass and the material of the housing 5, the quartz glass and the housing 5 are bonded together with an elastic adhesive.

The first flat plate 101 having such an opening 104 is manufactured by metal cutting work or die-casting. The first flat plate 101, the second flat plate 102, and the frame body 103 of the present example are formed of aluminum (Al). The first flat plate, the second flat plate, and the frame body are formed of a metallic material such as copper (Cu), stainless steel or titanium (Ti); general-purpose plastics such as polypropylene resin (PP), polystyrene resin (PS), polyvinyl chloride resin (PVC), polyethylene terephthalate resin (PET) or acrylonitrile butadiene styrene resin (ABS); engineering plastics such as polyamide resin (PA) or polycarbonate resin (PC); or super-engineering plastics such as a liquid crystal polymer, instead of aluminum.

Additionally, as illustrated in FIG. 5 and FIG. 6, a pair of supporting members 106 for supporting the heat dissipation member 9 is attached to a pair of wall surfaces that face each other, along the longitudinal direction of the frame body 103 so as to become parallel to an opening surface of the frame body 103.

The pair of supporting members 106 are intended to support both ends of the heat dissipation member 9 from below, are formed, for example, in various shapes such as a flat plate shape, and are fixed to the heat dissipation member 9 with screwing, a joining material or an adhesive. In addition, as for attachment positions of the supporting members 106 in the height direction to the frame body 103, it is preferable that the light irradiation device 2 to be disposed at the heat dissipation member 9 and the cover glass 6 are provided at positions as close to each other as possible to such a degree that they do not come into contact with each other when the heat dissipation member 9 is fixed to the supporting members 106. By bringing the light irradiation device 2 and the cover glass 6 as close to each other as possible to such a degree that they do not come into contact with each other, the light emitted from the light irradiation device 2 can be relatively effectively utilized, and illuminance degradation of the light irradiation device 2 resulting from the contamination of the light irradiation apparatus 1 caused by scattering or the like of the ultraviolet curable ink from an object can be suppressed.

In addition, in the present example, the supporting members 106 are not used, but the heat dissipation member 9 may be directly attached to the housing 5 with a joining material or an adhesive, a through-hole for screwing may be provided in the wall surface of the frame body 103, or the heat dissipation member 9 may be directly screwed and fixed to the housing 5a.

Also, the frame body 103 is provided with the through-hole 107, and the cooling pipe 4 and the external cooling pipe 7, which are connected to the supply port 90a and the discharge port 90b of the heat dissipation flow passage 90 provided in the heat dissipation member 9, are coupled together by the through-hole 107.

The cooling pipe 4 is formed of a resin tube such as a nylon tube, a urethane tube or a fluororesin tube, or a metallic tube such as a copper tube or a stainless steel tube. The material of the cooling pipe 4 may be appropriately selected according to the type of a refrigerant to be used for the cooling of the light irradiation device 2 and the constant current generation device 3a.

The housing 5 is formed by abutting against the frame body so that the first flat plate 101 covers the one side opening surface of the frame body 103 and the second flat plate 102 covers the other opening surface of the frame body 103, and fixing them with screwing, a joining material or an adhesive. By interposing a sealant made of a rubber material such as silicone rubber or nitrile rubber or a resin material such as fluororesin, silicone resin or urethane resin on an abutting surface between the first flat plate 101 and the frame body 103 and an abutting surface between the second flat plate 102 and the frame body 103, leakage of ultraviolet light from the light irradiation device 2 to the outside of the housing 5 or the like can be relatively excellently suppressed, and the ultraviolet curable ink or the cooling refrigerant entering from the outside to the housing 5 can be suppressed.

(Embodiment of Printing Apparatus)

Figure 7:
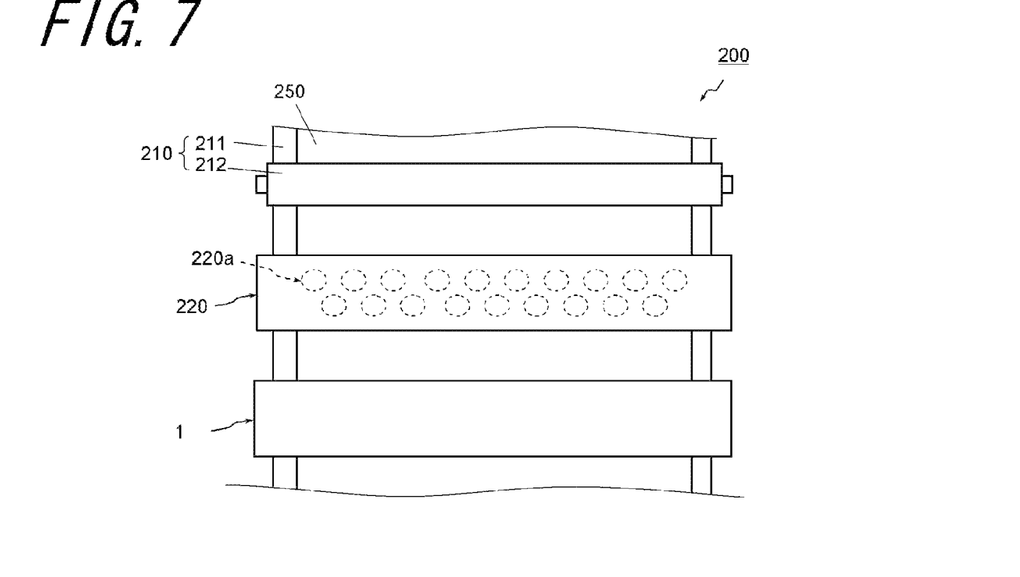
FIG. 7 is a top view of a printing apparatus using the light irradiation apparatus illustrated in FIG. 1.
Figure 8:
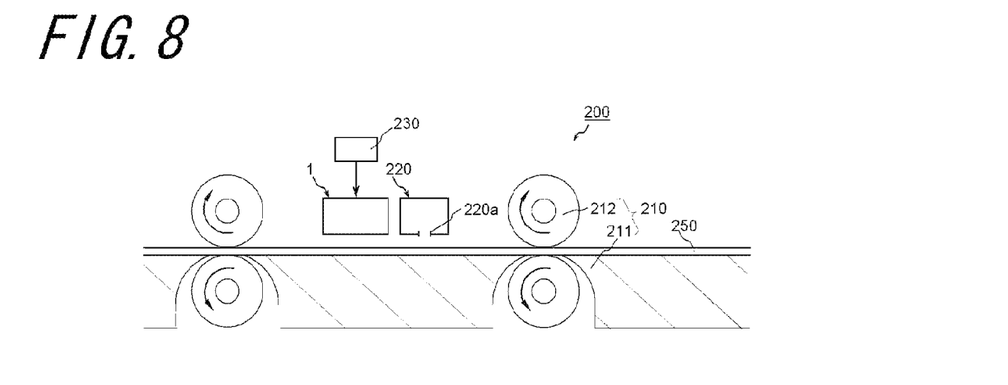
FIG. 8 is a side view of the printing apparatus illustrated in FIG. 7.

As an example of the embodiment of the printing apparatus of the invention, a printing apparatus 200 illustrated in FIG. 7 and FIG. 8 will be described as an example. The printing apparatus 200 includes a conveying mechanism 210 for conveying a recording medium 250, an inkjet head 220 serving as a printing mechanism for performing printing on the conveyed recording medium 250, the above-described light irradiation apparatus 1 that irradiates the recording medium 250 after the printing with ultraviolet rays, and a control mechanism 230 that controls the light emission of the light irradiation apparatus 1. Here, the recording medium 250 is equivalent to the above-described object.

The conveying mechanism 210 is intended to convey the recording medium 250 so as to pass through the inkjet head 220 and the light irradiation apparatus 1 in order, and includes a placement platform 211 and a pair of conveying rollers 212 that are disposed to face each other and are rotatably supported. By feeding the recording medium 250 supported by the placement platform 211 between the pair of conveying rollers 212 and rotating the conveying rollers 212, the recording medium 250 is delivered in the conveying direction.

The inkjet head 220 has the function of making a photosensitive material adhere to the recording medium 250 conveyed via the conveying mechanism 210. The inkjet head 220 is configured so as to discharge droplets including the photosensitive material toward the recording medium 250 and deposit the droplets on the recording medium 250. In the present example, the ultraviolet curable ink is adopted as the photosensitive material. Examples of the photosensitive material include photosensitive resist and photo-curable resin, in addition to the ultraviolet curable ink.

In the present example, a line-type inkjet head is adopted as the inkjet head 220. The inkjet head 220 has a plurality of discharge holes 220a that are arrayed in a line, and is configured so as to discharge the ultraviolet curable ink from the discharge holes 220a. The inkjet head 220 discharges ink from the discharge holes 220a to the recording medium 250 conveyed in a direction orthogonal to the array of the discharge holes 220a, and deposits the ink on the recording medium, thereby performing printing on the recording medium.

In addition, in the present example, as the printing mechanism, for example, a serial inkjet head may be adopted or a line-type or serial spray head may be adopted. Moreover, as the printing mechanism, an electrostatic head, which stores static electricity of the recording medium 250 and makes a photosensitive material adhere to the recording medium with the stored static electricity, may be adopted, or a liquid immersion device, which immerses the recording medium 250 in a liquid photosensitive material and makes this photosensitive material adhere to the recording medium, may be adopted. Moreover, a brush, a brush or a roller may be adopted as the printing mechanism.

In the printing apparatus 200, the light irradiation apparatus 1 has the function of exposing the photosensitive material adhering to the recording medium 250 that is conveyed via the conveying mechanism 210. The light irradiation apparatus 1 is provided on the downstream side of the inkjet head 220 in the conveying direction. Additionally, in the printing apparatus 200, the light-emitting element 20 has the function of exposing the photosensitive material adhering to the recording medium 250.

The control mechanism 230 has the function of controlling the light emission of the light irradiation apparatus 1. In a memory of the control mechanism 230, information showing features of light such that ink droplets discharged from the inkjet head 220 are relatively excellently cured is stored. A specific example of the stored information includes numerical values showing wavelength distribution properties and light emission intensity (light emission intensity of each wavelength band) that are suitable for curing ink droplets to be discharged. The printing apparatus 200 of the present example has the control mechanism 230, so that the magnitude of a driving current to be inputted to the plurality of light-emitting elements 20 can also be adjusted on the basis of the stored information of the control mechanism 230. From this, according to the printing apparatus 200, light can be radiated with a proper quantity of light depending on the properties of ink to be used, and ink droplets can be cured with light having relatively low energy.

In the printing apparatus 200, the conveying mechanism 210 conveys the recording medium 250 in the conveying direction. The inkjet head 220 discharges the ultraviolet curable ink to the recording medium 250 that is being conveyed, and makes the ultraviolet curable ink adhere to the surface of the recording medium 250. In this case, the ultraviolet curable ink made to adhere to the recording medium 250 may adhere totally, may adhere partially, or may adhere in a desired pattern. In the printing apparatus 200, the ultraviolet curable ink is cured by irradiating the ultraviolet curable ink adhered to the recording medium 250 with the ultraviolet rays emitted from the light irradiation apparatus 1.

According to the printing apparatus 200 of the present example, the above-described effects of the light irradiation apparatus 1 can be exhibited.

Although the example of the specific embodiment of the invention has been illustrated above, the invention is not limited to this, and various changes can be made without departing from the scope of the invention.

Figure 9:
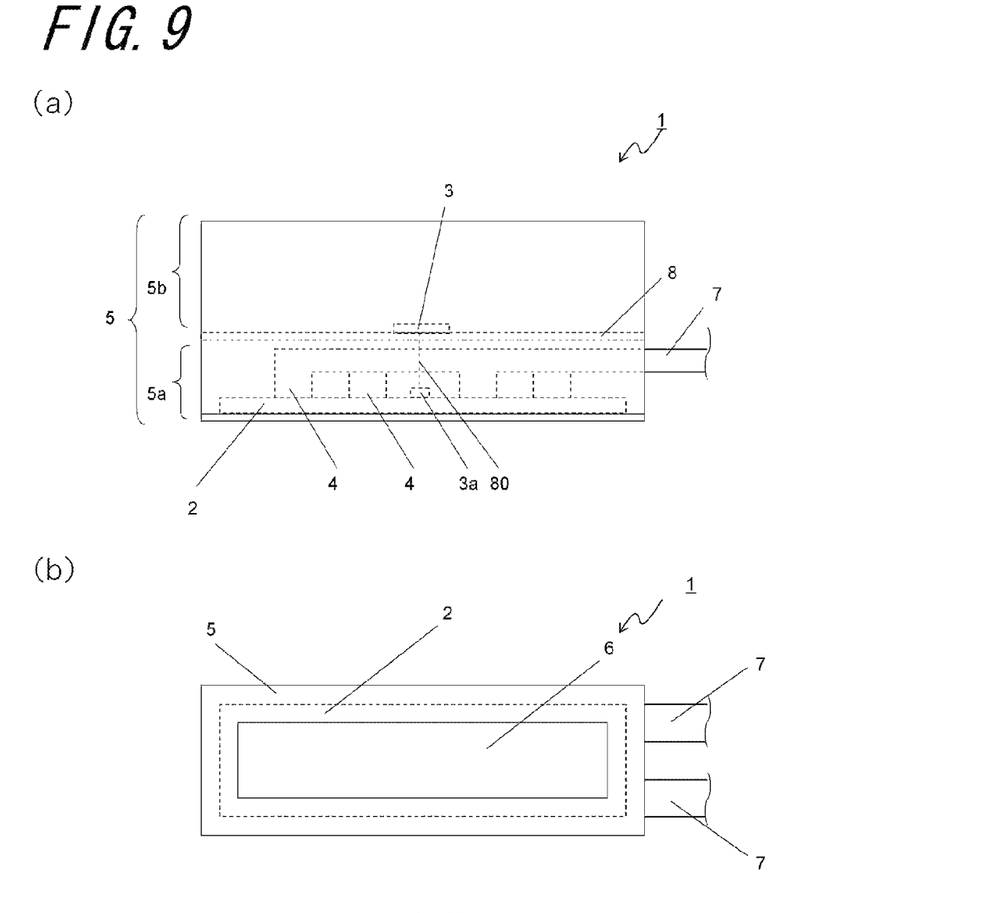
FIG. 9 is a first modified example of the light irradiation apparatus illustrated in FIG. 1.

For example, as in a first modified example illustrated in FIG. 9, the housing 5 may have a first space 5a that houses the light irradiation device 2, the constant current generation device 3a, the heat dissipation member 9 and the cooling pipe 4, and a second space 5b that houses the drive substrate 3. The first space 5a and the second space 5b are partitioned by a partition wall 8. The partition wall 8 of the first modified example, similar to the first flat plate 101, the second flat plate 102 and the frame body 103 that constitute the housing 5, is formed of a metallic material such as aluminum (Al), copper (Cu), stainless steel or titanium (Ti); general-purpose plastics such as polypropylene resin (PP), polystyrene resin (PS), polyvinyl chloride resin (PVC), polyethylene terephthalate resin (PET) or acrylonitrile butadiene styrene resin (ABS); engineering plastics such as polyamide resin (PA) or polycarbonate resin (PC); or super-engineering plastics such as a liquid crystal polymer.

The drive substrate 3 is disposed on a surface of the partition wall 8 on the second space 5b side. In the case of this first modified example, although not illustrated, the drive substrate 3 is fixed to the partition wall 8 by screwing. The fixation of the drive substrate 3 to the partition wall 8 may be bonding with an adhesive such as silicone resin or epoxy resin, may be metal joining such as soldering, and may be fixation using arbitrary methods. In addition, in the case of the first modified example, the drive substrate may be disposed on the surface of the partition wall 8 on the second space 5b side. However as long as the drive substrate is within the second space 5b, the drive substrate may be disposed on the second flat plate 102 or the frame body 103, or may be disposed on the partition wall 8, the second flat plate 102 and the frame body 103 via a spacer or the like.

In addition, the partition wall 8 may be a partition wall 8 including a heat insulating material with a thermal conductivity equal to or lower than 0.1 W/(m·K). As the heat insulating material, for example, a fiber-based heat insulating material such as glass wool or rock wool, or a foaming-based heat insulating material such as urethane foam, phenolic foam or polystyrene form can be used. Here, since the partition wall 8 including the heat insulating material is provided for the purpose of relatively preventing transfer of heat from being performed between the first space 5a and the second space 5b partitioned by the partition wall 8, the heat insulating material is disposed over the whole surface of the partition wall 8. As the heat insulating material that is disposed over the whole surface, a sheet-like heat insulating material is not necessarily used, and a heat insulating material of a fibrous shape, a mesh-shape or the like may be used.

Also, the constant current generation device 3a is bonded on the other main surface 9b of the heat dissipation member 9 via the adhesive 50 such as silicone resin or epoxy resin.

The drive substrate 3 and the constant current generation device 3a are electrically connected together via electrical wiring 80. The electrical wiring 80 passes through a through-hole (not illustrated) formed in the partition wall 8, and connects the drive substrate 3 disposed in the second space and the constant current generation device 3a disposed in the first space together. The through-hole may be airtightly sealed by a sealant made of a rubber material such as silicone rubber or nitrile rubber, or a resin material such as fluororesin, silicone resin or urethane resin so that airtightness between the first space 5a and the second space 5b is not impaired and so that no gap is formed between the through-hole and the electrical wiring 80.

By adopting such a configuration and by disposing the light irradiation device 2 and the constant current generation device 3a with a large amount of heat generation, respectively, on the one main surface 9a and the other main surface 9b of the heat dissipation member 9, cooling efficiency of the light irradiation device 2 and the constant current generation device 3a can be enhanced, and electrical reliability of the drive substrate 3 can be enhanced. For example, when dew condensation occurs in the first space 5a that houses the heat dissipation member 9 by allowing a refrigerant to flow through the heat dissipation member 9, since electrical wiring is often formed at relatively narrow pitches in the drive substrate 3, electrical short-circuiting may occur. However, since the drive substrate 3 is housed in the second space 5b isolated from the first space 5a that houses the heat dissipation member 9, the electrical reliability of the drive substrate 3 can be enhanced. That is, by housing the drive substrate 3 in the second space 5b partitioned from the first space 5a with the partition wall 8, dew condensation does not easily occur in the second space 5b even if the dew condensation has occurred in the first space 5a. Therefore, electrical short circuiting of the drive substrate 3 can be suppressed.

Additionally, by providing the partition wall 8 including the above heat insulating material, the transfer of heat between the first space 5a and the second space 5b can be reduced. Therefore, even if dew condensation occurs in the first space 5a, further occurrence of dew condensation in the second space 5b can be suppressed.

Figure 10:
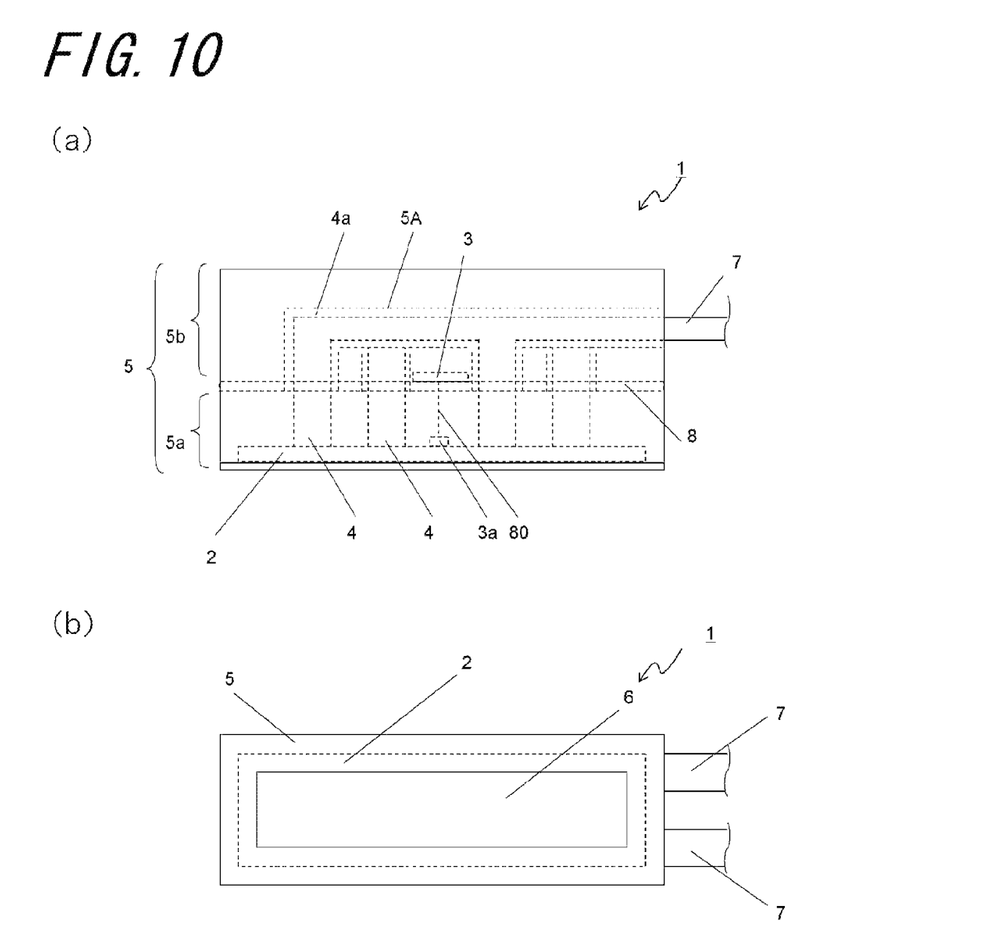
FIG. 10 is a second modified example of the light irradiation apparatus illustrated in FIG. 1.

Additionally, as a second modified example illustrated in FIG. 10, the first space 5a may have a through-hole 5A that passes through the second space 5b, and the cooling pipe 4 may be disposed in the through-hole 5A. The language "the first space 5a has the through-hole 5A that passes through the second space 5b" means that the cooling pipe 4 connected to the heat dissipation member 9 is disposed so as to extend from the first space 5a through the partition wall 8 to the second space 5b side and the periphery of the cooling pipe 4 disposed on the second space 5b side is disposed inside a double pipe 4a connected to the hole provided in the partition wall 8. That is, an internal space of the double pipe 4a disposed on the second space 5b side is equivalent to a through-hole of the first space 5a. The same material as the first flat plate 101, the second flat plate 102, the frame body 103, and the partition wall 8 that constitute the housing 5 can used for the double pipe 4a.

By adopting such a configuration, design flexibility of the cooling pipe 4 within the housing 5 can be increased.

Moreover, the constant current generation device 3a may be disposed on the other main surface 9b of the heat dissipation member 9 by an intermediary of an insulating material, which is not illustrated. Although the constant current generation device 3a is bonded to the heat dissipation member 9 via the adhesive 50 such as silicone resin or epoxy resin, if the heat dissipation member 9 is made of a metallic material such as copper (Cu) or aluminum (Al), in order to sufficiently secure the electrical insulation between the heat dissipation member 9 and the constant current generation device 3a, the constant current generation device may be disposed by an intermediary of an insulating material 100. In this case, the constant current generation device 3a and the insulating material 100 as well as the insulating material 100 and the heat dissipation member 9 may be bonded to each other via the adhesive 50 such as silicone resin or epoxy resin.

Moreover, the embodiment of the printing apparatus 200 is not limited to the above embodiment. For example, a so-called offset printing type printer that rotates a supported roller and conveys a recording medium along a roller surface may be adopted, and the same effects are exhibited even in this case.

Although an example in which the light irradiation apparatus 1 is applied to the printing apparatus 200 using the inkjet head 220 is illustrated in the present example, the light irradiation apparatus 1, for example, can also be applied to curing of various kinds of photo-curable resin, such as a dedicated device that cures photo-curable resin that is spin-coated on the surface of a target body. Additionally, the light irradiation apparatus 1 may be used for, for example, an irradiation light source or the like in an exposure device.

REFERENCE SIGNS LIST

1: Light irradiation apparatus
2: Light irradiation device
3: Drive substrate
3a: Constant current generation device
4: Cooling pipe
4a: Double pipe
5: Housing
5a: First space
5b: Second space
5A: Through-hole
6: Cover glass
7: External cooling pipe
8: Partition wall
9: Heat dissipation member
9a: One main surface
9b: Other main surface
10: Base
11a: One surface
11b: Other surface
12: Opening
13: Connection pad
14: Inner peripheral surface
15: Joining material
20: Light-emitting element
21: Element substrate
22: Semiconductor layer
23, 24: Element electrode
30: Sealing material
40: Stacked body
41: First insulating layer
42: Second insulating layer
50: Adhesive
70: Internal electrical wiring
80: Electrical wiring
90: Heat dissipation flow passage
90a: Supply port
90b: Discharge port
100: Insulating material
101: First flat plate
102: Second flat plate
103: Frame body
104: Opening
106: Supporting member
107: Through-hole
200: Printing apparatus
210: Conveying mechanism
211: Placement platform
212: Conveying roller
220: Inkjet head
220a: Discharge hole
230: Control mechanism
250: Recording medium

The invention claimed is:
1. A light irradiation apparatus, comprising:
a housing configured to house
   a light irradiation device comprising a plurality of light-emitting elements arranged;

a drive substrate which is configured to drive the plurality of light-emitting elements, and comprises a circuit to which a constant current generation device is electrically connected;
a heat dissipation member having a plate-shape; and
a cooling pipe configured for allowing a refrigerant to flow into the heat dissipation member,
wherein
the light irradiation device is disposed on one main surface of the heat dissipation member,
the constant current generation device is disposed on the other main surface of the heat dissipation member or on the drive substrate, the drive substrate being disposed on the other main surface of the heat dissipation member, and
the housing has
a first space that houses the light irradiation device, the constant current generation device, the heat dissipation member and the cooling pipe, and
a second space that houses the drive substrate.

2. The light irradiation apparatus according to claim 1, wherein the first space has a through-hole that passes through the second space, and the cooling pipe is disposed within the through-hole.

3. The light irradiation apparatus according to claim 1, wherein the constant current generation device is disposed on the other main surface of the heat dissipation member by an intermediary of an insulating material.

4. The light irradiation apparatus according to claim 1, wherein the first space and the second space are partitioned with a partition wall including a heat insulating material with a thermal conductivity equal to or lower than 0.1 W/(m·K).

5. A printing apparatus, comprising:
conveying means that conveys a recording medium having light permeability;
printing means that carries out printing on a recording medium with an ultraviolet curable ink or an ultraviolet curable resin; and
the light irradiation apparatus according to claim 1 that irradiates the recording medium printed with light.

* * * * *